(12) United States Patent
Miyajima et al.

(10) Patent No.: US 6,703,302 B2
(45) Date of Patent: Mar. 9, 2004

(54) METHOD OF MAKING A LOW DIELECTRIC INSULATION LAYER

(75) Inventors: Hideshi Miyajima, Yokohama (JP); Miyoko Shimada, Yokohama (JP); Rempei Nakata, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/141,578

(22) Filed: May 9, 2002

(65) Prior Publication Data

US 2002/0173138 A1 Nov. 21, 2002

(30) Foreign Application Priority Data

May 10, 2001 (JP) .......................... 2001-140275
May 22, 2001 (JP) .......................... 2001-151918

(51) Int. Cl.[7] .......................................... H01L 21/4763
(52) U.S. Cl. .................... 438/622; 438/597; 438/687
(58) Field of Search ............................. 438/622, 687, 438/637, 597, 618

(56) References Cited

U.S. PATENT DOCUMENTS

| 5,952,243 A | 9/1999 | Forester et al. | |
|---|---|---|---|
| 6,177,143 B1 * | 1/2001 | Treadwell et al. | 427/515 |
| 6,489,030 B1 * | 12/2002 | Wu et al. | 428/447 |
| 2002/0131246 A1 * | 9/2002 | Hawker et al. | 361/270 |

FOREIGN PATENT DOCUMENTS

JP    11-506872    6/1999

OTHER PUBLICATIONS

Miyoko Shimada et al, "High–Performance Low–K Dielectric Using Advanced EB–Cured Process", Interface 416–417, (Sep. 2001).

Shimada et al.; "Method of Manufacturing Semiconductor Device", U.S. patent application Serila No. 09/982,003, filed on Oct. 19, 2001.

Copy of U.S. patent application Ser. No. 10/105,432, filed Mar. 26, 2002, to Miyajima et al.

* cited by examiner

Primary Examiner—Richard Elms
Assistant Examiner—Brad Smith
(74) Attorney, Agent, or Firm—Finnegan, Henderson, Farabow, Garrett & Dunner, L.L.P.

(57) ABSTRACT

A method for manufacturing a semiconductor device, comprising forming a low dielectric constant insulating film containing Si atoms over a semiconductor substrate, heating the low dielectric constant insulating film while irradiating the low dielectric constant insulating film with an electron beam, and exposing the low dielectric constant insulating film during or after the heating to a gas promoting the bond formation of the Si atoms.

16 Claims, 3 Drawing Sheets

METHOD OF MAKING A LOW DIELECTRIC INSULATION LAYER

CROSS-REFERENCE TO RELATED APPLICATIONS

This application is based upon and claims the benefit of priority from the prior Japanese Patent Applications No. 2001-140275, filed May 10, 2001; and No. 2001-151918, filed May 22, 2001, the entire contents of both of which are incorporated herein by reference.

BACKGROUND OF THE INVENTION

1. Field of the Invention

The present invention relates to method for manufacturing a semiconductor device, particularly to a method of manufacturing a semiconductor device provided with an interlayer insulating film having a low dielectric constant.

2. Description of the Related Art

In recent years, the wiring layer, which was of a single layer structure in the past, has come to be of a multi-layer structure in accordance with progress in the miniaturization and the operating speed of the semiconductor device. As a matter of fact, a semiconductor device having a metal wiring structure including 5 layers or more has been developed and put into commercial production. However, with progress in the miniaturization of the semiconductor device, the delay in the signal propagation caused by the parasitic capacitance between the adjacent wirings and the wiring resistance forms a serious problem. To be more specific, with employment of a multi-layered wiring structure, the problem that the delay in the signal propagation derived from the multi-layered wiring structure obstructs the high speed operation of the semiconductor device becomes serious.

Various measures have been taken to date for avoiding the delay in the signal propagation accompanying the employment of the multi-layered wiring structure. In general, the delay in the signal propagation can be represented by the product between the parasitic capacitance between the adjacent wirings and the wiring resistance. In order to improve the delay in the signal propagation, it is naturally desirable to lower the parasitic capacitance between the adjacent wirings and to decrease the wiring resistance.

To decrease the wiring resistance, it has been tried to change the main constituting material of the wiring to a material having a lower resistivity. For example, it has been tried to change the conventional aluminum wiring into a copper wiring. In this case, however, it is very difficult to form copper wiring by a dry etching process like the conventional aluminum wiring. Therefore, in the case of using copper wiring, employed is the technology of a buried wiring structure.

Also, to lower the parasitic capacitance between the adjacent wirings, it has been tried to form, for example, an insulating film containing SiOF as a main component by a CVD method in place of the conventional $SiO_2$-based insulating film. Further, it has been tried to form a so-called "SOG" (Spin On Glass) film having a relative dielectric constant lower than that of the $SiO_2$ insulating film or a low dielectric constant insulating film such as an organic resin film by a spin coating method.

In general, the practical lower limit of the relative dielectric constant of the conventional $SiO_2$ insulating film is said to be about 3.9. On the other hand, it is said that the SiOF insulating film permits lowering the relative dielectric constant to about 3.3. It is said, however, that it is very difficult in view of the stability of the film to lower practically the relative dielectric constant of the SiOF insulating film to a level lower than 3.3. On the other hand, it is said that the relative dielectric constant of the SOG film or a low dielectric constant insulating film such as an organic resin film can be lowered to about 2.0. Such being the situation, vigorous researches are being made in an attempt to develop a technology for forming such an SOG film or a low dielectric constant insulating film.

For example, it is disclosed in Japanese Laid-open Patent Application No. 11-506872 that a low dielectric constant insulating film having excellent characteristics can be formed by coating a semiconductor substrate with a material of an insulating film so as to form a coated film, followed by irradiating the coated film with an electron beam.

BRIEF SUMMARY OF THE INVENTION

A method for manufacturing a semiconductor device according to one embodiment of the present invention comprises:

forming a low dielectric constant insulating film containing Si atoms over a semiconductor substrate;

heating the low dielectric constant insulating film while irradiating the low dielectric constant insulating film with an electron beam; and exposing the low dielectric constant insulating film during or after the heating to a gas promoting the bond formation of the Si atoms.

A method for manufacturing a semiconductor device according to another embodiment of the present invention comprises:

forming a low dielectric constant insulating film over a semiconductor substrate;

heating the low dielectric constant insulating film under an atmosphere containing an inert gas while irradiating the low dielectric constant insulating film with an electron beam; and irradiating the low dielectric constant insulating film during or after the heating with positively charged ions.

Further, a method for manufacturing a semiconductor device according to still another embodiment of the present invention comprises:

forming a low dielectric constant insulating film containing an organic component over a semiconductor substrate;

transferring the semiconductor substrate into a process chamber;

heating the low dielectric constant insulating film while irradiating the low dielectric constant insulating film with an electron beam within the process chamber;

transferring the semiconductor substrate out of the process chamber after the heating;

introducing an oxidizing gas into the process chamber; and applying a high frequency voltage to a region within the process chamber having the oxidizing gas introduced therein so as to generate a plasma and, thus, to clean the process chamber.

DETAILED DESCRIPTION OF THE INVENTION

Some embodiments of the present invention will now be described with reference to the accompanying drawings.
(Embodiment 1)

The present inventors have found that a low dielectric constant film formed by heating the film while irradiating the film with an electron beam, particularly, a low dielectric constant insulating film containing Si atoms, tends to absorb moisture. The moisture absorption is promoted because the Si atoms contained in the insulating film have dangling bonds by the irradiation with an electron beam. The silicon dangling bonds present in the insulating film are active and, thus, react with water when the insulating film is exposed to the air atmosphere, as shown in reaction formula (1) given below:

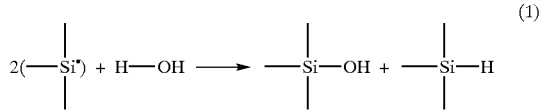

(1)

Also, the $CH_3$ group bonded to Si atom is oxidized by water even during the baking by an electron beam irradiation, as shown in reaction formula (2) given below:

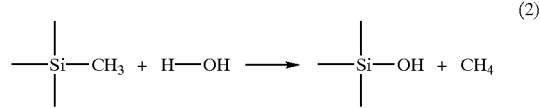

(2)

The silanolic hydroxyl group (Si—OH) formed by the reaction in reaction formulas (1) and (2) given above forms a so-called "moisture absorption site" which readily absorbs water in the air atmosphere. Therefore, where such a low dielectric constant insulating film is left to stand under the air atmosphere, the relative dielectric constant of the insulating film tends to be increased. Alternatively, the insulating film that has absorbed water within the air atmosphere tends to release a gas from within the insulating film during the heat treatment after the baking step. What should be noted is that the insulating film containing the residual silanolic hydroxyl group tends to be degraded so as to lower the performance thereof, leading to deterioration in the performance of the semiconductor device.

The problem pointed out above has been solved in one embodiment of the present invention by exposing the low dielectric constant insulating film containing Si atoms to a gas promoting the bond formation of the Si atom. To be more specific, the method of manufacturing a semiconductor device according to one embodiment of the present invention comprises forming a low dielectric constant insulating film containing Si atoms over a semiconductor substrate, heating the low dielectric constant insulating film while irradiating the insulating film with an electron beam, and exposing the low dielectric constant insulating film during or after the heating to a gas promoting the bond formation of the Si atom.

Figure 1:
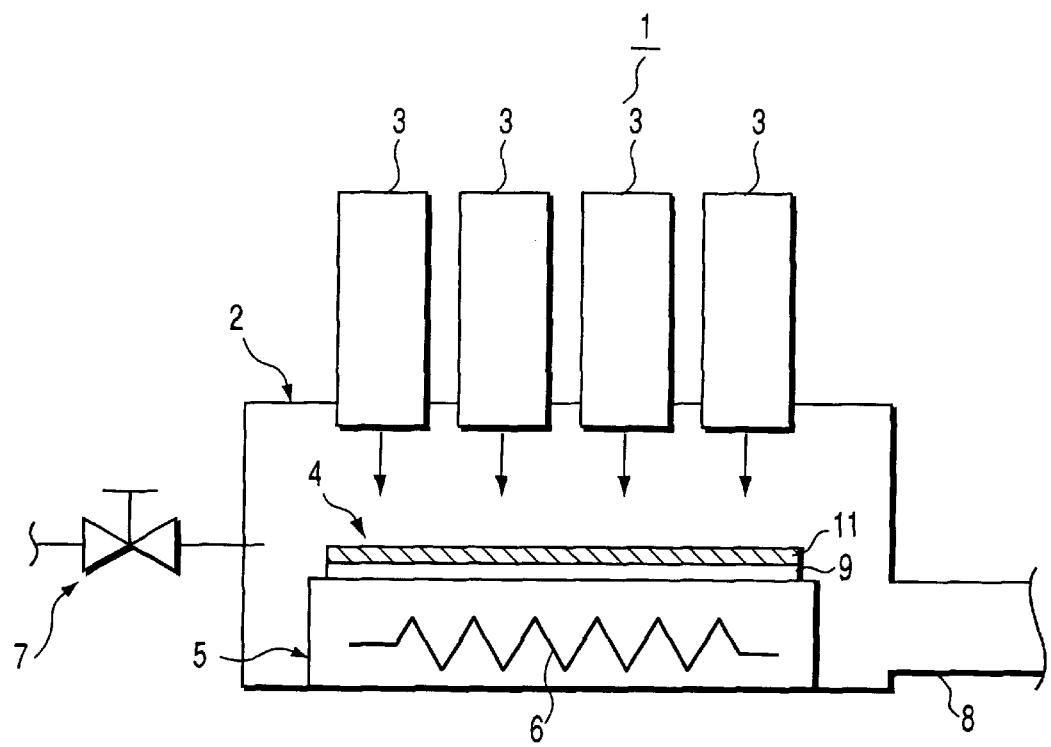
FIG. 1 schematically shows a heating apparatus used in the method of manufacturing a semiconductor device according to one embodiment of the present invention.

FIG. 1 exemplifies the construction of a heating apparatus 1 used in the method according to embodiment 1 of the present invention.

As shown in FIG. 1, the heating apparatus 1 comprises a process chamber 2 for baking a low dielectric constant insulating film 11. An electron beam source 3 capable of emitting an electron beam (EB) toward the entire region of the material for forming the low dielectric constant insulating film 11 coated on a semiconductor substrate 9 is arranged in an upper portion of the process chamber 2. Also, a substrate supporting base 5 on which is disposed the semiconductor substrate 9 is arranged below the four electron beam sources 3 inside the process chamber 2. The substrate supporting base 5 is arranged as a hot plate provided with a heating means (Joule heating) 6 so as to make it possible to heat the coated film formed on the surface of the semiconductor substrate 9. The heating is performed by using the electron beam sources 3 and the hot plate while irradiating the material for forming the low dielectric constant insulating film 11 on the semiconductor substrate 9 with an electron beam.

When the low dielectric constant insulating film 11 is baked, it is possible to introduce a desired gas into the process chamber 2 through a gas introducing valve 7 or a gas supply source (not shown). Also, when the low dielectric constant insulating film 11 is baked, it is possible to set the atmosphere within the process chamber 2 at a desired reduced pressure via a vacuum exhaust port 8. An opening-closing valve (not shown), a pressure adjusting device (not shown) and an exhaust pump (not shown) are arranged downstream of the vacuum exhaust port 8. These members make it possible to set the atmosphere within the process chamber 2 at a prescribed pressure.

Figure 2:
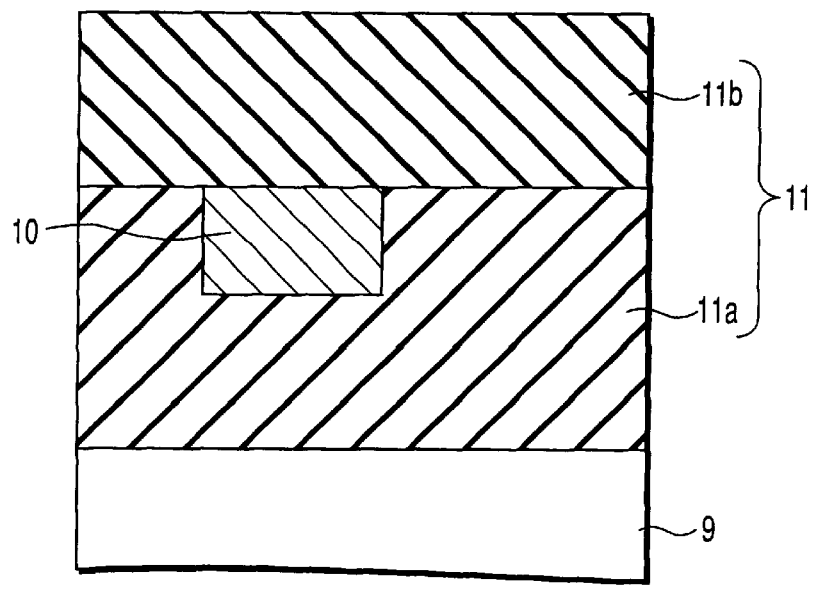
FIG. 2 is cross-sectional view showing an insulating film included in a semiconductor device manufactured by the method according to one embodiment of the present invention.

The method according to embodiment 1 of the present invention can be applied in forming, for example, a second low dielectric constant insulating film 11b on a first low dielectric constant insulating film 11a formed on the semiconductor substrate 9, as shown in FIG. 2. An element (not shown) is formed on the semiconductor substrate 9. It should be noted that a buried wiring 10 containing Cu as a main component is formed in the first low dielectric constant insulating film 11a. It is also possible to employ the method according to embodiment 1 of the present invention for forming the first low dielectric constant insulating film 11a.

For example, the first low dielectric constant insulating film 11a is coated with a material of the second low dielectric constant insulating film 11b by a spin coating method so as to form a thin film having a substantially uniform thickness.

It is possible to use, for example, a varnish prepared by dissolving a precursor of methyl polysilsesquioxane (MSQ) in a solvent can be used as the material of the second low dielectric constant insulating film.

A coated film having a substantially uniform thickness can be formed by coating the first low dielectric constant insulating film 11a with the varnish noted above by a spin coating method. The semiconductor substrate 9 having the coated film formed thereon is disposed on the hot plate so as to heat the coated film under a nitrogen gas atmosphere at 50 to 150° C. for 1 to 10 minutes, e.g., at about 100° C. for about 2 minutes, followed by further heating the coated film at 150 to 250° C. for 1 to 10 minutes, e.g., at about 200° C. for about 2 minutes. The solvent or the like contained in the coated film is evaporated and removed by heating stepwise the coated film as described above. As a result, the components other than MSQ such as the solvent contained in the coated film can be removed substantially completely. It follows that an insulating film formed essentially of MSQ alone is fixed to the first low dielectric constant insulating film 11a. It is also possible to use a lamp heater for heating the coated film. Alternatively, the solvent can be removed by disposing the coated film under an atmosphere of a reduced pressure of about $1 \times 10^{-2}$ to 500 Torr.

After completion of the stepwise heating, the temperature of the insulating film is elevated by the hot plate to a prescribed temperature over about 60 seconds so as to further heat the insulating film. It is desirable for the heating to be carried out at 250 to 450° C. for 1 to 60 minutes, e.g., at about 400° C. for about 30 minutes. Where the heating temperature is low or where the heating time is short, it is difficult to perform the heating sufficiently. On the other hand, where the heating temperature is excessively high or where the heating time is excessively long, the diffusion of Cu used as the wiring material or the hillock generation tend to be promoted. It follows that it is difficult to form a high quality film in a short time and at a low temperature when the film is baked by the heating alone.

Under the circumstances, the insulating film is irradiated with an electron beam during the heating. Prior to the irradiation with the electron beam, the inner space of the process chamber 2 is evacuated by the vacuum pump through the vacuum exhaust port 8 to a vacuum of about 1 to 500 Torr, and a mixed gas comprising an Ar gas and an $NF_3$ gas is introduced from a gas supply source into the process chamber 2 through the gas introducing valve 7. The flow rate of the mixed gas is set at about 1 to 10 L/min, e.g., about 3 L/min. Particularly, it is desirable to introduce the mixed gas containing an Ar gas and an $NF_3$ gas mixed at a volume ratio of about 9:1 and to irradiate the mixed gas with an electron beam under the state that the pressure of the mixed gas is held at about 10 Torr by the pressure adjusting device and the vacuum pump through the vacuum exhaust port 8.

The gas containing a halogen element such as $NF_3$ performs the function of promoting the bond formation of the Si atoms contained in the insulating film. It is also possible to use, for example, an $F_2$ gas, a $CF_4$ gas or a $C_2F_6$ gas as the gas containing a halogen element. The mixing ratio of the Ar gas to the gas containing a halogen element is not particularly limited. It is possible to obtain a reasonable effect as far as the mixed gas contains traces of a gas containing a halogen element. It is also possible to use a halogen-containing gas singly.

An electron beam having a prescribed magnitude of the irradiating energy is emitted from the electron beam source 3 toward the entire region of the insulating film as denoted by arrows in FIG. 1. The electron beam has an energy of about 1 to 50 keV, e.g., about 20 keV, and the dose of the electron beam is set at about 100 to 2000 $\mu C/cm^2$, e.g., about 1000 $\mu C/cm^2$. The irradiating time is set at about 1 to 60 minutes, e.g., about 30 minutes. Where the dose is small or where the irradiating time is short, it is difficult to obtain a sufficient effect of the electron beam. On the other hand, where the dose is excessively large, or where the irradiating time is excessively long, the shrinkage of the film is promoted so as to increase the stress and, thus, tends to bring about the generation of crack. It is also possible to bring about disadvantages such increases in the relative dielectric constant and the hygroscopicity. It is desirable to control the electron beam irradiation amount appropriately in accordance with the material used so as not to degrade the characteristics of the insulating film.

The effect of the electron beam irradiation can be obtained, if the insulating film is uniformly irradiated with an electron beam having the energy and the dose set as described above. The generating method of the electron beam and the number of electron beam sources used are not particularly limited in the present invention.

A fixed insulating film is irradiated with the electron beam. If a coated film, which is not fixed, is irradiated with the electron beam, the components other than MSQ such as the solvent contained in the coated film are also denatured, with the result that the characteristics of the resultant low dielectric constant insulating film tend to be impaired. It is possible to prevent such an inconvenience by removing in advance the solvent by evaporation. In other words, it is possible to form an MSQ film having undesired components such as a solvent removed therefrom as the second low dielectric constant insulating film 11b having desired characteristics.

The second low dielectric constant insulating film 11b thus formed was observed with electron spin resonance (ESR), with the result that Si dangling bonds were scarcely recognized. Also, moisture absorption sites such as the silanolic hydroxyl group based on the dangling bond were scarcely recognized. It is considered reasonable to understand the situation as follows.

Specifically, the second low dielectric constant insulating film 11b is irradiated with the electron beam under a mixed gas comprising an Ar gas and an $NF_3$ gas. Upon irradiation with the electron beam, the $NF_3$ gas is decomposed into a plurality of different kinds of fragments. Fluorine, which is one of these decomposed fragments, reacts with the Si dangling bonds present in the second low dielectric constant insulating film 11b or with the Si—OH group based on the dangling bond, as denoted by reaction formulas (3) and (4) given below:

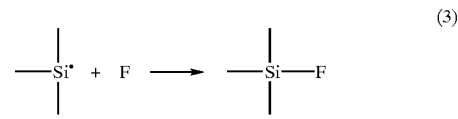

(3)

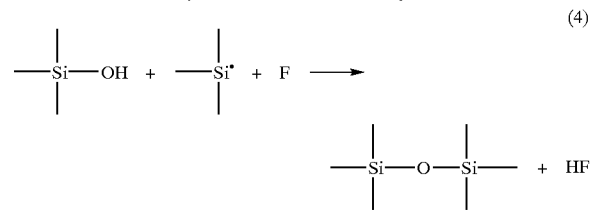

(4)

As apparent from reaction formula (3) given above, the Si dangling bond is terminated with F, which is a non-hydrophilic atom. Also, as apparent from reaction formula (4) given above, F permits the silanolic hydroxyl group based on the Si dangling bond and the other dangling bond to form a siloxane group. As a result, the second low dielectric constant insulating film 11b is unlikely to absorb water even if the insulating film 11b is left to stand under the air atmosphere. It follows that it is possible to suppress the inconveniences that the relative dielectric constant is increased and that the gas is released from within the insulating film. The particular situation will now be described based on specific data.

Figure 3:
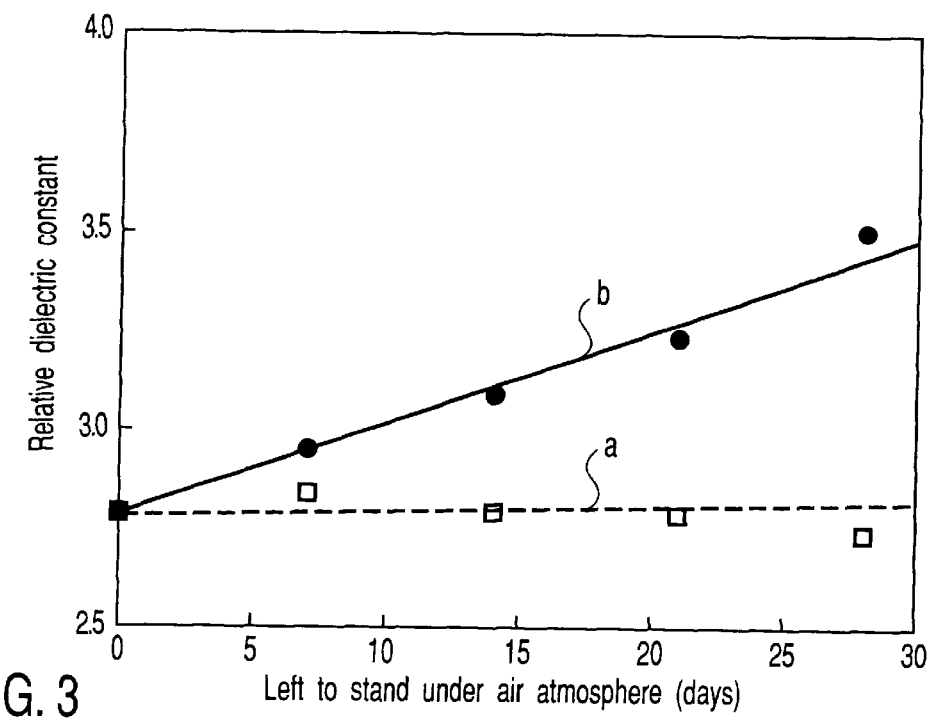
FIG. 3 is a graph showing the change in the relative dielectric constant of an insulating film.

FIG. 3 is a graph showing the change with time in the relative dielectric constant of the MSQ film that was left to stand under the air atmosphere. A broken line "a" in the graph of FIG. 3 covers the MSQ film prepared by the method according to embodiment 1 of the present invention, i.e., the MSQ film formed by irradiating an insulating film with an electron beam under a $F_2$ gas. On the other hand, a solid line "b" covers the MSQ film prepared by irradiating an insulating film with an electron beam under an Ar gas. As apparent from the broken line "a", the MSQ film included in the semiconductor device manufactured by the method according to embodiment 1 of the present invention is highly stable. Specifically, the relative dielectric constant of the MSQ film remains substantially constant even if the MSQ film is left to stand under the air atmosphere. On the other hand, the MSQ film prepared by the electron beam irradiation under an Ar gas is unstable. Specifically, as apparent from the solid line "b", the relative dielectric constant of the MSQ film is increased with time when the MSQ film is left to stand under the air atmosphere.

Figure 4:
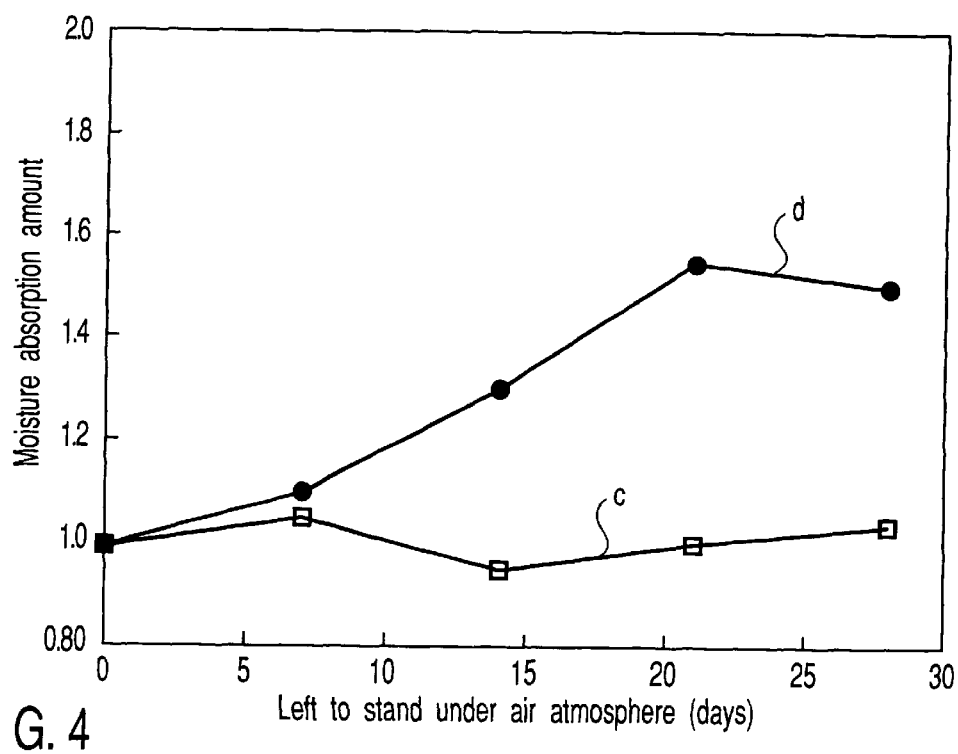
FIG. 4 is a graph showing the change in the moisture absorption of an insulating film.

FIG. 4 is a graph showing the change with time in the moisture absorption amount of the MSQ film when the MSQ film is left to stand under the air atmosphere. The moisture absorption amount was measured as follows. Specifically, in the first step, each of the films was degassed and analyzed immediately after the films were formed. In this case, the temperature of the atmosphere within which two films were disposed was increased from room temperature to about 450° C., and the integrated value of the water released from each film during the temperature elevation period was measured on the basis that the integrated value of the water released from the two films immediately after formation was set at 1. Then, the degassing analysis was performed as above a plurality of times for every prescribed days for each MSQ film. A ratio of the integrated value of the released water amount to the integrated value of the water amount released from each film immediately after formation was calculated every time. The result of the calculation performed every time the degassing analysis was performed is plotted for each of the two MSQ films together with the value immediately after the film formation so as to obtain the graph of FIG. 4.

Line "c" shown in FIG. 4 covers the MSQ film formed by the method according to embodiment 1 of the present invention, i.e., the MSQ film prepared by irradiating an insulating film with an electron beam under a $F_2$ gas. On the other hand, line "d" covers the MSQ film prepared by irradiating an insulating film with an electron beam under an Ar gas. When it comes to the MSQ film included in the semiconductor device manufactured by the method according to embodiment 1 of the present invention, the amount of the moisture absorption is not increased even if the MSQ film is left to stand under the air atmosphere and, thus, the MSQ film exhibit excellently stable characteristics, as apparent from line "c". On the other hand, when it comes to the MSQ film prepared by irradiating an insulating film with an electron beam under an Ar gas, the amount of the moisture absorption is increased with time and, thus, the MSQ film is unstable.

As described above, the second low dielectric constant insulating film 11b included in the semiconductor device manufactured by the method according to embodiment 1 of the present invention is substantially free from increases in the relative dielectric constant and in the moisture absorption amount and, thus, is unlikely to incur deterioration in the performance. A similar effect can be obtained in also the case where the first dielectric constant insulating film 11a is prepared by the similar method. Naturally, the low dielectric constant insulating film 11 comprising the first low dielectric constant insulating film 11a and the second low dielectric constant insulating film 11b is unlikely to incur deterioration in its performance. It should also be noted that the various electronic circuits such as the Cu wiring 10 are protected by the low dielectric constant insulating film 11. It follows that the semiconductor device manufactured by the method according to embodiment 1 of the present invention is substantially free from deterioration in the electrical performance.

It is possible to form a plug and a wiring layer by forming a hole and a wiring groove in the second low dielectric constant insulating film 11b by the ordinary method, followed by burying Cu in the hole and the wiring groove through a barrier metal layer made of, for example, TaN.

It is also possible to use a hydrogen gas as a gas promoting the bond formation of the Si atom. In this case, reactions represented by reaction formulas (5) and (6) given below take place:

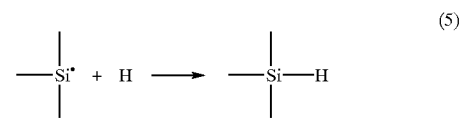

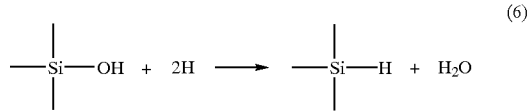

As apparent from reaction formula (5), the Si dangling bond is terminated with hydrogen, which is a non-hydrophilic atom. Also, the silanolic hydroxyl group based on the Si dangling bond is replaced by H, as shown in reaction formula (6). The reaction given by reaction formula (6) is a dehydration reaction, which is opposite to the reaction in which the water in the air atmosphere is absorbed.

Further, it is possible to promote the bond formation of the Si atom by using an organic Si compound gas having a silanolic hydroxyl group. The organic Si compound gas having silanol includes, for example, trimethyl silanol. In this case, the reaction represented by reaction formula (7) given below takes place:

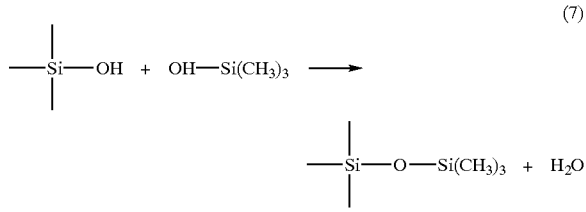

Alternatively, it is also possible to use an organic gas having a hydroxyl group. The organic gas having a hydroxyl group, which can be used in the present invention, includes, for example, methanol, ethanol and butanol. It is also possible to use phenolic compounds. In the case of using, for example, methanol, the reaction represented by reaction formula (8) given below takes place:

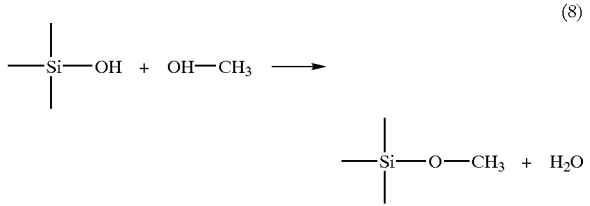

(8)

As apparent from reaction formulas (7) and (8) given above, the silanolic hydroxyl group based on the Si dangling bond disappears. The reaction given by these reaction formulas is a dehydration reaction, which is opposite to the reaction in which the water in the air atmosphere is absorbed.

It should be noted that, in the case of using both an organic Si compound gas having a silanolic hydroxyl group and an organic gas having a hydroxyl group, the Si dangling bond is subjected to the reactions represented by reaction formulas (9) and (10) given below:

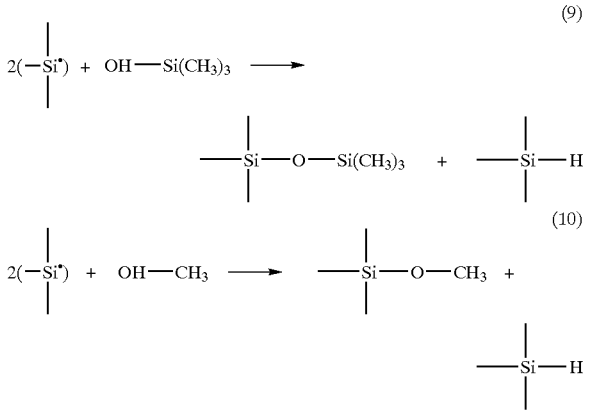

(9)

(10)

In each of the reactions represented by reaction formulas (9) and (10), the Si dangling bond disappears.

It is possible to use each of the hydrogen gas, the organic Si compound gas having a silanolic hydroxyl group and the organic gas having a hydroxyl group together with an Ar gas to form a mixed gas like the gas having a halogen element. In this case, the mixing ratio of the hydrogen gas or the like not particularly limited. It is possible to obtain a reasonable effect as far as the mixed gas contains even traces of the hydrogen gas or the like. Alternatively, it is possible to use singly each of the hydrogen gas, the organic Si compound gas having a silanolic hydroxyl group and the organic gas having a hydroxyl group.

As described above, it is possible to form a low dielectric constant insulating film, which permits suppressing the increases in the relative dielectric constant and the moisture absorption amount, by heating an insulating film under a gas promoting the bond formation of the Si atom while irradiating the insulating film with an electron beam.

A similar effect can also be obtained in the case where the insulating film heated under an electron beam irradiation is exposed to a gas promoting the bond formation of the Si atom. In this case, it is possible to expose once the insulating film after the heating to the air atmosphere. Also, a similar effect can be obtained in the case where the gas promoting the bond formation of the Si atom is excited in advance. The particular gas can be excited by the discharge by, for example, a microwave.

It is possible to modify in various fashions the method of manufacturing the semiconductor device according to embodiment 1 of the present invention.

For example, it is possible to obtain the effects similar to those described above if the technical idea of embodiment 1 of the present invention is applied to the process of forming a low dielectric constant insulating film of a single layer structure or a low dielectric constant insulating film of a multi-layered structure including three or more layers. Also, the low dielectric constant insulating film formed by applying a heat treatment to an insulating film while irradiating the insulating film with an electron beam under a gas promoting the bond formation of the Si atom is not limited to an MSQ film. For example, it is possible to use a raw material of a siloxane thin film having a low dielectric constant such as a hydrogen silsesquioxane (HSQ) film. It was possible to obtain effects similar to those described above also in the case where an insulating film was formed of the particular material and the formed insulating film was subjected to a heat treatment under a prescribed gas and irradiated with an electron beam.

The insulating film irradiated with an electron beam can be formed by a CVD method, a vapor deposition method, a sputtering method or a vapor deposition polymerization method as well as by the coating method employed in embodiment 1 described previously.

(Embodiment 2)

As a result of an extensive research, the present inventors have found that electrons remain on the surface layer of a low dielectric constant insulating film obtained by the irradiation with an electron beam while heating the insulating film, with the result that a potential difference is generated between the surface layer of the low dielectric constant insulating film and the semiconductor substrate.

A gate electrode and a gate insulating film are formed in advance on a semiconductor substrate in the step of forming a low dielectric constant insulating film. It follows that, if a potential difference is generated between the surface layer of the low dielectric constant insulating film and the semiconductor substrate, the breakdown voltage of the gate insulating film tends to be lowered. Also, so-called "electrostatic damage" such as the fluctuation in the operating voltage of the gate tends to be generated so as to bring about an inconvenience in the operation of the semiconductor device.

The problems pointed out above have been overcome by irradiating an insulating film with positively charged ions. To be more specific, the method of manufacturing a semiconductor device according to embodiment 2 of the present invention comprises forming a low dielectric constant insulating film over a semiconductor substrate; heating the low dielectric constant insulating film under an atmosphere containing an inert gas while irradiating the insulating film with an electron beam, and irradiating the low dielectric constant insulating film during or after the heating with positively charged ions.

Figure 5:
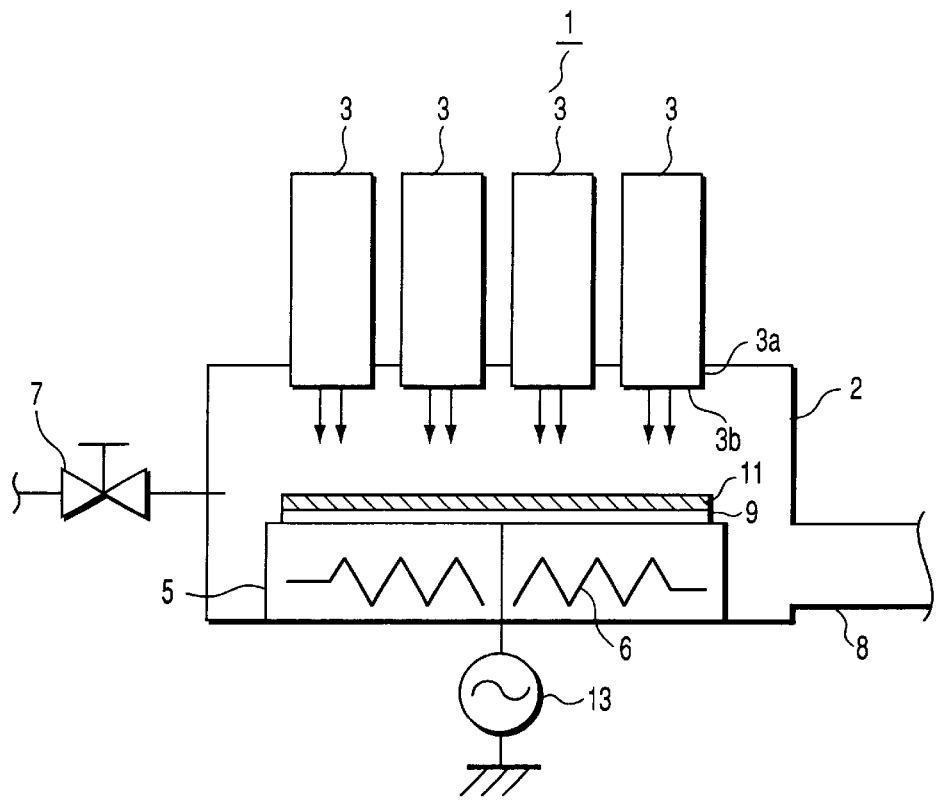
FIG. 5 schematically shows a heating apparatus used for the method of manufacturing a semiconductor device according to another embodiment of the present invention.

FIG. 5 exemplifies the construction of the heating apparatus 1 used in the method according to embodiment 2 of the present invention. The apparatus 1 shown in FIG. 5 is substantially equal to that shown in FIG. 1, except that an electrode (not shown) is arranged in the substrate supporting base 5 and a high frequency power source 13 for applying a high frequency voltage to the semiconductor substrate 9 via the electrode is mounted in the apparatus 1 shown in FIG. 5. A plasma can be generated within the process chamber 2 by applying a high frequency voltage from the high frequency power source 13 to the electrode mounted in the substrate supporting base 5. It is possible to arrange the electrode separately from the substrate supporting base 5. For example, it is possible to arrange the electrode in any region of the side wall of the process chamber 2 surrounding the semiconductor substrate 9. Incidentally, FIG. 5 clearly shows a partition wall 3a serving to suppress the influence given by the gas released from the insulating film and an electron beam transmitting window 3b for transmitting an electron beam.

The manufacturing method of a semiconductor device according to embodiment 2 of the present invention can be performed by using an apparatus for manufacturing a semiconductor device, comprising:

a process chamber in which a reduced pressure can be set up;

a substrate supporting section arranged within the process chamber supporting a semiconductor substrate having a low dielectric constant insulating film formed thereon;

an electron beam source irradiating the low dielectric constant insulating film with an electron beam;

a heater heating said semiconductor substrate;

an electrode arranged within said process chamber;

a high frequency power source applying a high frequency voltage to said electrode; and a gas introducing system introducing a gas into said process chamber.

The manufacturing method of a semiconductor device according to embodiment 2 of the present invention will now be described with reference to FIGS. 6A and 6B.

Figures 6A, 6B:
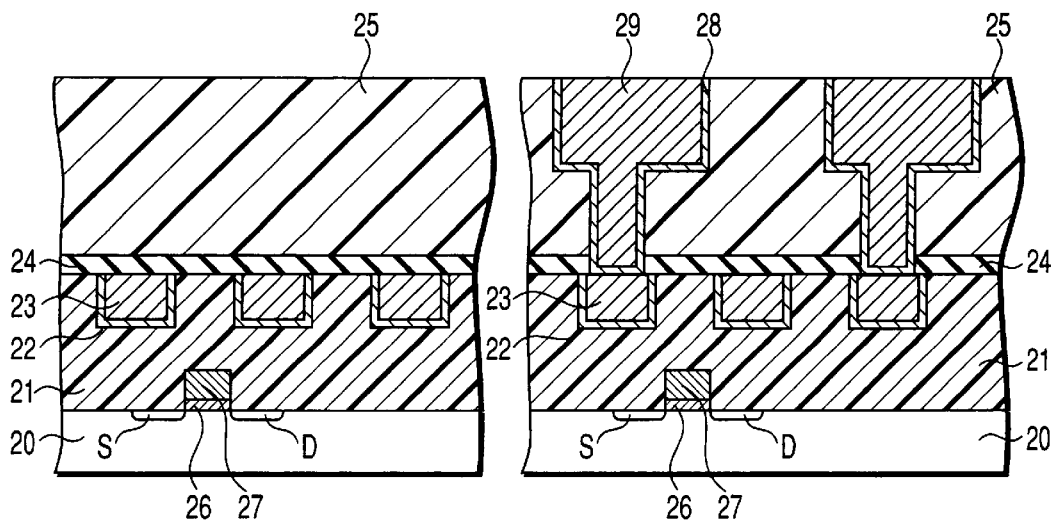
FIGS. 6A and 6B are cross-sectional views each showing the construction of a wiring included in a semiconductor device manufactured by the method according to another embodiment of the present invention.

In the first step, a first interlayer insulating film 21, a SiN film 24 and a second interlayer insulating film 25 are successively formed on a semiconductor substrate 20, as shown in FIG. 6A. It should be noted that, in the semiconductor substrate 20, a gate electrode 27 is formed on a gate insulating film 26 between a source region S and a drain region D. It is possible for the first interlayer insulating film 21 to be formed of a $SiO_2$ film deposited by a CVD method. As shown in the drawing, a wiring layer 23 formed of, for example, Cu is buried in the first interlayer insulating film 21 with a barrier metal layer 22 formed of, for example, TaN interposed therebetween. On the other hand, it is possible for the second interlayer insulating film 25 to be formed of, for example, a silicon oxide film containing an organic component. For example, an MSQ film can be used as the second interlayer insulating film 25. The method according to embodiment 2 of the present invention can be employed for forming the second interlayer insulating film 25.

In the first step, the SiN film 24 is coated with a material of the second interlayer insulating film 25 by, for example, a spin coating method so as to form a coated film having a substantially uniform thickness. Then, the solvent is removed from the coated film by an optional method described previously in conjunction with embodiment 1 so as to fix the insulating film.

Further, the insulating film is heated within the process chamber 2 shown in FIG. 5 while irradiating the insulating film with an electron beam. The heating temperature and the heating time can be set equal to those described previously in conjunction with embodiment 1. Prior to the electron beam irradiation, the pressure within the process chamber 2 is reduced to about 1 to 500 Torr by a vacuum pump through the vacuum exhaust port 8 so as to introduce an Ar gas from a gas supply source into the process chamber 2 through the gas introducing valve 7. The flow rate of the Ar gas is set at about 1 to 10 L/min, e.g., at about 3 L/min. Particularly, it is desirable to irradiate the insulating film with an electron beam under the state that the pressure within the process chamber 2 is held at about 10 Torr by the pressure adjusting device and the vacuum pump through the vacuum exhaust port 8.

A rare gas such as an Ar gas, i.e., an optional gas that is inactive and does not give influences to a silicon oxide film containing an organic component such as MSQ, can be used as a gas introduced into the process chamber 2. In this case, the term "influence" noted above includes a chemical reaction and a physical sputtering. It is also possible to mix a hydrogen gas with the rare gas introduced into the process chamber 2.

The conditions for the electron beam irradiation such as the energy and the dose can be set equal to those for embodiment 1 described previously.

In embodiment 2, a high frequency voltage of 13.56 MHz is applied from the high frequency power source 13 to the electrode in irradiating the insulating film with an electron beam. By application of the high frequency voltage, a plasma is formed above the semiconductor substrate 9. Also, since a negative self-bias voltage is applied to the semiconductor substrate 9 disposed on the electrode, the argon ions $Ar^+$ charged positive in the plasma are attracted toward the semiconductor substrate 9. As a result, the MSQ film formed on the semiconductor substrate 9 is irradiated simultaneously with both electrons ($e^-$) charged negative and argon ions $Ar^+$ charged positive, with the result that the charged state is neutralized on the surface layer. It therefore follows that it is possible to suppress the generation of electrostatic damage.

It should be noted that, in irradiating the MSQ film with positively charged ions, it is desirable to control the operation so as to prevent the MSQ film from being etched undesirably by the physical function.

It is possible to control appropriately the dose and the timing of irradiation of the electron beam and the positively charged ions. By the appropriate control, it is possible to suppress the nonuniform distribution of charge and the generation of electrostatic damage so as to further lower the defect generation rate of the semiconductor device. For example, the dose and the irradiating timing of the electron beam and the positively charged ions can be controlled as follows:

Method 1: The MSQ film is heated while irradiating the MSQ film with an electron beam. At the same time, the MSQ film is irradiated with positively charged ions ($Ar^+$).

Method 2: Method 1 given above is modified such that the electron beam irradiation is performed intermittently. In this case, the MSQ film is intermittently irradiated with the electron beam such that the amount of the electron beam required for the baking of the MSQ film is divided into prescribed sections and the MSQ film is irradiated with the divided amount of the electron beam each time the electron beam irradiation is performed. This method permits decreasing the dose of the electron beam required for each electron beam irradiation so as to make it possible to prevent the nonuniform distribution of charge in the MSQ film.

Method 3: Method 2 given above is modified such that a hydrogen gas is further supplied so as to carry out the electron beam irradiation within an atmosphere containing H. In this case, it is possible for H to permit the crystal state of the MSQ film to be restored so as to further suppress the generation of electrostatic damage.

The second interlayer insulating film 25 is formed by any of the methods described above. It has been confirmed by the driving characteristic test of a transistor that the influence of electrostatic damage has been suppressed in the interlayer insulating film 25 thus obtained. It follows that it is possible to avoid a detrimental effect given to the gate electrode and the gate insulating film formed in advance on the semiconductor substrate 20.

A hole and a groove are formed by, for example, RIE (reactive ion etching) in the second interlayer insulating film 25 thus formed, followed by burying, for example, a Cu layer 29 in the hole and the groove with a barrier metal layer 28 comprising, for example, TaN interposed therebetween, thereby forming a dual damascene wiring structure as shown in FIG. 6B.

Further, an upper interlayer insulating film is formed as required. In this case, it is possible to apply the treatment described above to the upper interlayer insulating film so as to suppress the generation of electrostatic damage.

It should be noted that, it is possible to apply the method according to embodiment 2 of the present invention to the process of forming an optional insulating film included in a semiconductor device so as to obtain similar effects. Particularly, it is effective to apply the method according to embodiment 2 of the present invention to the process of forming an interlayer insulating film positioned in a relatively lower layer in a multi-layered wiring structure, wiring layers being formed in a high density in the interlayer insulating film. In this case, it is possible to manufacture a semiconductor device that permits suppressing the parasitic capacitance between adjacent wirings so as to suppress the lowering in the propagation speed of signals and to suppress the generation of electrostatic damage.

Semiconductor devices were actually manufactured by applying methods 1 to 3 referred to previously so as to look into the defect generation ratio caused by electrostatic damage. The term "defect" denotes that the transistor driving characteristics of the test wafer having a transistor structure does not meet the specified value, and the term "defect generation ratio" denotes the ratio of the number of defective transistors to the total number of transistors formed on the wafer. The conditions such as the temperature for the heating treatment, the energy and dose of the electron beam, and pressure inside the process chamber were as described previously. The defect generation ratios for methods 1, 2 and 3 were 14%, 17% and 2%, respectively.

For comparison, semiconductor devices were also manufactured by forming interlayer insulating films under the same conditions, except that the interlayer insulating films were not irradiated with positively charged ions. In this case, the defect generation ratio caused by electrostatic damage was high, i.e., 48%.

As described above, it has been confirmed that it is possible to markedly lower the defect generation ratio of the semiconductor device caused by electrostatic damage by applying the method according to embodiment 2 of the present invention.

It is possible to modify in various fashions the method of manufacturing the semiconductor device according to embodiment 2 of the present invention. For example, the low dielectric constant film formed by heating an insulating film and irradiating the insulating film with positively charged ions while irradiating the insulating film with an electron beam is not limited to an MSQ film. Specifically, it is possible to form the low dielectric constant insulating film by using, for example, the raw material of a siloxane thin film having a low dielectric constant such as a hydrogen silsesquioxane (HSQ) film. Further, it is possible to use an organic resin such as polyarylene polyether or polyimide. It has been confirmed that effects similar to those described previously can also be obtained in the case where an insulating film is formed by using these materials and the insulating film thus formed is subjected to a heat treatment and electron beam irradiation under a prescribed gas atmosphere.

Where the dose of the electron beam is low, e.g., not higher than 100 $\mu C/cm^2$, it is possible to irradiate the insulating film after the heat treatment, which was performed while irradiating the insulating film with an electron beam, with positively charged ions.

Also, it is possible to form the insulating film that is irradiated with positively charged ions by the CVD method, the vapor deposition method, the sputtering method, or the vapor deposition polymerization method as well as by the coating method employed in the embodiment described above.

The technology described above, which employs in combination the heat treatment accompanying the electron beam irradiation and the irradiation with positively charged ions, can also be applied to the process of forming a resist pattern. By applying a similar treatment to a resist film, the mechanical strength of the resist film can be improved, with the result that it is possible to improve the processing accuracy in forming a resist pattern. Also, since the resistance to etching of the resist pattern used as a mask is improved, it is possible to improve the etching process accuracy of the work film. Further, it is possible to suppress the generation of electrostatic damage so as to make it possible to suppress the defect generation ratio of the semiconductor device.

(Embodiment 3)

Where a low dielectric constant film formed by heating the film while irradiating the film with an electron beam contains an organic component, an inconvenience may be generated as follows. Specifically, if an insulating film containing an organic component is heated while being irradiated with an electron beam, the organic component is evaporated from the insulating film. Where the particular treatments are successively applied to a plurality of semiconductor substrates, the evaporated organic component is deposited on, for example, the inner wall of the process chamber 2, the partition wall 3a of the electron beam source 3 and the surface of the electron beam transmitting window 3b so as to form a film. The film thus formed constitutes the source of dust generation within the process chamber 2. Specifically, the particular film is peeled off so as to float and to be deposited in various portions within the process chamber 2 so as to obstruct the electron beam irradiation. Also, where the deposited film remains on the electron beam transmitting window 3b, the transmission of the electron beam is obstructed so as to lower the dose of the electron beam. This particular tendency is prominent particularly where 10 or more semiconductor substrates are consecutively processed.

As a result, it is possible to fail to obtain a sufficient electron beam irradiation on the semiconductor substrate 9 so as to lower the mechanical strength of the insulating film.

It is possible to remove the film of the organic component deposited inside the process chamber 2 by introducing an oxidizing gas into the process chamber 2 and by applying a high frequency voltage to the oxidizing gas so as to generate a plasma.

To be more specific, the method of manufacturing a semiconductor device according to embodiment 3 of the present invention comprises forming a low dielectric constant insulating film over a semiconductor substrate; transferring the semiconductor substrate into a process chamber; heating the low dielectric constant insulating film while irradiating the low dielectric constant insulating film with an electron beam within said process chamber; transferring the semiconductor substrate out of the process chamber after the heating; introducing an oxidizing gas into the process chamber; and applying a high frequency voltage to a region within the process chamber having the oxidizing gas introduced therein so as to generate a plasma and, thus, to clean the process chamber.

To be more specific, about 10 semiconductor substrates were processed by the method according to embodiment 2 of the present invention by using the apparatus shown in FIG. 5. After completion of the processing, a vacuum state was established within the process chamber 2 so as to transfer the semiconductor substrates out of the process chamber 2.

In the next step, an oxygen gas used as an oxidizing gas was introduced into the process chamber 2 via the gas introducing valve 7 at a flow rate of about 3 L/min. It is also possible to introduce an ammonia gas or a mixed gas comprising an oxygen gas and an ammonia gas into the process chamber 2 as an oxidizing gas. In this step, the pressure inside the process chamber 2 is maintained at about 10 Torr by a pressure control mechanism.

Further, a high frequency voltage of 13.56 MHz is applied from the high frequency power source 13 to the electrode so as to generate an oxygen plasma within the process chamber 2. The film containing an organic component, which is deposited inside the process chamber 2, is removed by the etching function of the oxygen plasma. It is possible to remove the film containing an organic component, which is deposited on the inner wall of the process chamber 2, the electron beam transmitting window 3b and the sensor (not shown), by the discharge for at least about 15 minutes.

It is possible to suppress dust generation within the process chamber 2 by removing the deposited film within the process chamber 2 so as to clean the process chamber 2. As a result, it is possible to maintain the desired dose of the electron beam so as to prevent the effect produced by the heat treatment and the electron beam irradiation from being lowered.

The cleaning treatment described above was performed every time about 10 semiconductor substrates were processed by applying methods 1 to 3 referred to previously in conjunction with embodiment 2. As a result, it has been found possible to manufacture a semiconductor device equipped with a low dielectric constant insulating film having a high mechanical strength and excellent characteristics even if the semiconductor substrates are consecutively processed. In addition, the defect generation ratio of the resultant semiconductor devices caused by electrostatic damage has been found to be substantially equal to those described previously.

It is possible to employ the methods of embodiments 1 to 3 described above in combination. In this case, it is possible to obtain simultaneously the effects described previously in conjunction with each of embodiments 1 to 3.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:

forming a low dielectric constant insulating film containing Si atoms over a semiconductor substrate;

heating said low dielectric constant insulating film while irradiating the low dielectric constant insulating film with an electron beam; and exposing the low dielectric constant insulating film during or after the heating to a gas promoting the bond formation of said Si atoms, said gas promoting the bond formation of said Si atoms being selected from the group consisting of a gas containing a halogen element, an organic Si compound gas having a silanolic hydroxyl group, and an organic gas having a hydroxyl group.

2. The method for manufacturing a semiconductor device according to claim 1, wherein said low dielectric constant insulating film is exposed to said gas promoting the bond formation fo the Si atoms simultaneously with the heating accompanying said electron beam irradiation.

3. The method for manufacturing a semiconductor device according to claim 1, wherein dangling bonds of the Si atoms are terminated with a hydrophobic atom.

4. The method for manufacturing a semiconductor device according to claim 3, wherein said hydrophbic atom is selected from the group consisting of a hydrogen atom and a halogen atom.

5. The method for manufacturing a semiconductor device according to claim 1, wherein the material of said low dielectric constant insulating film has a siloxane structure as a main skeleton.

6. The method for manufacturing a semiconductor device according to claim 5, wherein said siloxane structure has a methyl group.

7. The method for manufacturing a semiconductor device according to claim 1, further comprising:

forming at least one of a wiring groove and a hole in said low dielectric constant insulating film; and burying Cu in at least one of said wiring groove and said hole with a brrier metal interposed therebetween.

8. A method for manufacturing a semiconductor device, comprising:

forming a low dielectric constant insulating film over a semiconductor substrate;

heating said low dielectric constant insulating film under an atmosphere containing an inert gas while irradiating said low dielectric constant insulating film with an electron beam within a process chamber having a reduced pressure; and irradiating the low dielectric constant insulating film during or after the heating with positively charged ions within said process chamber having a reduced pressure, said positively charged ion being generated by forming a plasma of said inert gas within said process chamber.

9. The method for manufacturing a semiconductor device according to claim 8, wherein the irradiating said low dielectric constant insulating film with positively charged ions is carried out simultaneously with the heating the low dielectric constant insulating film while irradiating the low dielectric constant insulating film with an electron beam.

10. The method for manufacturing a semiconductor device according to claim 9, wherein said low dielectric constant insulating film is intermittently irradiated with said electron beam.

11. The method for manufacturing a semiconductor device according to claim 8, wherein said atmosphere contains hydrogen.

12. The method for manufacturing a semiconductor device according to claim 8, wherein the material of said low dielectric constant insulating film has a siloxane structure as a main skeleton.

13. The method of manufacturing a semiconductor device according to claim 8, wherein said low dielectric constant insulating film is formed of an organic resin.

14. The method for manufacturing a semiconductor device according to claim 8, further comprising:

forming at least one of a wiring groove and a hole in said low dielectric constant insulating film; and burying Cu in at least one of said wiring groove and said hole with a barrier metal interposed therebetween.

15. A method for manufacturing a semiconductor device, comprising:

forming a low dielectric constant insulating film containing an organic component over a semiconductor substrate;

transferring said semiconductor substrate into a process chamber;

heating said low dielectric constant insulating film while irradiating said low dielectric constant insulating film with an electron beam within said process chamber;

transferring said semiconductor substrate out of said process chamber after the heating;

introducing an oxidizing gas into said process chamber; and applying a high frequency voltage to a region within said process chamber having said oxidizing gas introduced therein so as to generate a plasma and, thus, to clean said process chamber.

16. The method for manufacturing a semiconductor device according to claim 15, wherein said oxidizing gas contains at least one of an oxygen gas and an ammonia gas.

* * * * *